(12) United States Patent
Goyal

(10) Patent No.: US 6,375,768 B1
(45) Date of Patent: Apr. 23, 2002

(54) METHOD FOR MAKING BIAXIALLY TEXTURED ARTICLES BY PLASTIC DEFORMATION

(75) Inventor: Amit Goyal, Knoxville, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

(21) Appl. No.: 09/571,073

(22) Filed: May 15, 2000

Related U.S. Application Data

(62) Division of application No. 09/112,894, filed on Jul. 9, 1998.

(51) Int. Cl.⁷ ................................................. C21D 9/08
(52) U.S. Cl. ...................... 148/519; 148/525; 148/537; 505/470; 505/500
(58) Field of Search ............................. 148/512, 519, 148/525, 537; 505/236, 237, 470, 500

(56) References Cited

U.S. PATENT DOCUMENTS

| | | | |
|---|---|---|---|
| 5,739,086 A | 4/1998 | Goyal et al. ............... | 505/473 |
| 5,741,377 A | 4/1998 | Goyal et al. ............... | 148/512 |
| 5,898,020 A | 4/1999 | Goyal et al. | |
| 5,958,599 A | 9/1999 | Goyal et al. | |
| 5,964,966 A | * 10/1999 | Goyal et al. ............... | 148/426 |
| 5,968,877 A | 10/1999 | Budai et al. ............... | 505/237 |
| 6,180,570 B1 | * 1/2001 | Goyal ......................... | 505/236 |

FOREIGN PATENT DOCUMENTS

WO          96/32201      * 10/1996

OTHER PUBLICATIONS

K. Sato et al., "High–$J_c$ Silver–Sheathed Bi–Based Superconducting Wires", *IEEE Transactions on Magnetics*, 27 (1991) 1231.

K. Heine, et al., "High–Field Critical Current Densities in $Bi_2Sr_2Ca_1Cu_2O_{8+x}$/Ag Wires", *Applied Physics Letters*, 55 (1989) 2441.

R. Flukiger et al., "High Critical Current Densities in Bi(2223)/Ag tapes", *Superconductor Science & Technology* 5, (1992) S61.

D. Dimos et al., "Orientation Dependence of Grain–Boundary Critical Currents in $Y_1Ba_2Cu_3O_{7-*}$ Bicrystals", *Physical Review Letters*, 61 (1988) 219.

D. Dimos et al., "Superconducting Transport Properties of Grain Boundaries in $Y_1Ba_2Cu_3O_7$ Bicrystals", *Physical Review B*, 41 (1990) 4038.

Y.Iijma, et al., "Structural and Transport Properties of Biaxially Aligned $YBa_2Cu_3O_{7-x}$ Films on Polycrystalline Ni–Based Alloy with Ion–Beam Modified Buffer Layers", *Journal of Applied Physics*, 74 (1993) 1905.

R. P. Reade, et al. "Laser Deposition of biaxially textured Yttria–Stabilized Zirconia Buffer Layers on Polycrystalline Metallic Alloys for High Critical Current Y–Ba–Cu–O Thin Films", *Applied Physics Letters*, 61 (1992) 2231.

D. Dijkkamp et al., "Preparation of Y–Ba–Cu Oxide Superconducting Thin Films Using Pulsed Laser Evaporation from High Tc Bulk Material," *Applied Physics Letters*, 51, 619 (1987).

(List continued on next page.)

*Primary Examiner*—George Wyszomierski
(74) *Attorney, Agent, or Firm*—Joseph A. Marasco

(57) ABSTRACT

A method of preparing a biaxially textured article comprises the steps of providing a metal preform, coating or laminating the preform with a metal layer, deforming the layer to a sufficient degree, and rapidly recrystallizing the layer to produce a biaxial texture. A superconducting epitaxial layer may then be deposited on the biaxial texture. In some embodiments the article further comprises buffer layers, electromagnetic devices or electro-optical devices.

24 Claims, 11 Drawing Sheets

OTHER PUBLICATIONS

S. Mahajan et al., "Effects of Target and Template Layer on the Properties of Highly Crystalline Superconducting a–Axis Films of $YBa_2Cu_3O_{7-x}$ by DC–Sputtering," *Physica C*, 213, 445 (1993).

A. Inam et al., "A–axis Oriented Epitaxial $YBa_2Cu_3O_{7-x}$ Heterostructures," *Applied Physics Letters*, 57, 2484 (1990).

A. Goyal et al., "High Critical Current Density Superconducting Tapes by Epitaxial Deposition of $YBA_2Cu_3O_x$ Thick Films on Biaxially Textured Metals", *Applied Physics Letters*, 69, 1795, 1996.

A. Goyal et al., "Conductors with Controlled Grain Boundaries: An Approach to the Next Generation, High Temperature Superconducting Wire", *Journal of Materials Research*, 12, 2924, 1997.

* cited by examiner

Deformable metal/alloy rod or plate

Coat rod with Ni using any technique

Roll to form tape and anneal

METHOD FOR MAKING BIAXIALLY TEXTURED ARTICLES BY PLASTIC DEFORMATION

CROSS-REFERENCE TO RELATED APPLICATIONS

This patent application is a Divisional Application of U.S. patent application Ser. No. 09/112,894 "Biaxially Textured Articles Formed by Plastic Deformation" filed Jul. 7, 1998, which is incorporated herein by reference. The following are also incorporated herein by reference: U.S. Pat. No. 5,741,377, Structures Having Enhanced Biaxial Texture and Method of Fabricating Same, filed Apr. 10, 1995 by Goyal et al., issued Apr. 21, 1998; U.S. Pat. No. 5,739,086, Structures Having Enhanced Biaxial Texture and Method of Fabricating Same, filed Apr. 10, 1995 by Goyal et al., issued Apr. 14, 1998; and U.S. Ser. No. 08/670,871 High Tc YBCO Superconductor Deposited on Biaxially Textured Ni Substrate, filed Jun. 26, 1996 by Budai et al., issued Oct. 19, 1999.

This invention was made with Government support under Contract No. DE-AC0596OR22464 awarded by the United States Department of Energy. The Government has certain rights in the invention.

FIELD OF THE INVENTION

The present invention relates to biaxially textured, composite, metallic substrates and articles made therefrom, and more particularly to such substrates and articles made by plastic deformation processes such as rolling and subsequently recrystallizing high purity cubic materials to form long lengths of biaxially textured sheets, and more particularly to the use of said biaxially textured sheets as templates to grow biaxially textured, epitaxial metal/alloy/ceramic layers.

BACKGROUND OF THE INVENTION

Current materials research aimed at fabricating high-temperature superconducting ceramics in conductor configurations for bulk, practical applications, is largely focused on powder-in-tube methods. Such methods have proved quite successful for the Bi—(Pb)—Sr—Ca—Cu—O (BSCCO) family of superconductors due to their unique mica-like mechanical deformation characteristics. In high magnetic fields, this family of superconductors is generally limited to applications below 30° K. In the Re—Ba—Cu—O (ReBCO, Re denotes a rare earth element), Tl—(Pb,Bi)—Sr—(Ba)—Ca—Cu—O and Hg—(Pb)—Sr—(Ba)—Ca—Cu—O families of superconductors, some of the compounds have much higher intrinsic limits and can be used at higher temperatures.

It has been demonstrated that these superconductors possess high critical current densities (Jc) at high temperatures when fabricated as single crystals or in essentially single-crystal form as epitaxial films on single crystal substrates such as $SrTiO_3$ and $LaAlO_3$. These superconductors have so far proven intractable to conventional ceramics and materials processing techniques to form long lengths of conductor with JC comparable to epitaxial films. This is primarily because of the "weak-link" effect.

It has been demonstrated that in ReBCO, biaxial texture is necessary to obtain high transport critical current densities. High $J_c$'s have been reported in polycrystalline ReBCO in thin films deposited on special substrates on which a biaxially textured non-superconducting oxide buffer layer is first deposited using ion-beam assisted deposition (IBAD) techniques. IBAD is a slow, expensive process, and difficult to scale up for production of lengths adequate for many applications.

High $J_c$'s have also been reported in polycrystalline ReBCO melt-processed bulk material which contains primarily small angle grain boundaries. Melt processing is also considered too slow for production of practical lengths.

Thin-film materials having perovskite-like structures are important in superconductivity, ferroelectrics, and electrooptics. Many applications using these materials require, or would be significantly improved by, single crystal, c-axis oriented perovskite-like films grown on single-crystal or highly aligned metal or metal-coated substrates.

For instance, $Y—Ba_2—Cu_3—O_x$ (YBCO) is an important superconducting material for the development of superconducting current leads, transmission lines, motor and magnetic windings, and other electrical conductor applications. When cooled below their transition temperature, superconducting materials have essentially no electrical resistance and carry electrical current without heating up. One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents and remain superconducting, however, the YBCO films must be biaxially textured, preferably c-axis oriented, with effectively no large-angle grain boundaries, since such grain boundaries are detrimental to the current-carrying capability of the material. YBCO films deposited on polycrystalline metal substrates do not generally meet this criterion.

It has been demonstrated that high critical current densities can be obtained in YBCO films that have been epitaxially deposited on biaxially textured Ni. However, for practical superconductivity applications it would be desirable to have a biaxially textured metal substrate with reduced or no magnetism, with increased strength and better thermal expansion match to the superconductor.

The present invention provides a method for fabricating biaxially textured composite substrates with desirable compositions. This provides for applications involving epitaxial devices on such alloy substrates. The alloys can also be thermal expansion and lattice parameter matched by selecting appropriate compositions. They can then be processed according to the present invention, resulting in devices with high quality films with good epitaxy and minimal microcracking.

The terms "process", "method", and "technique" are used interchangeably herein.

For further information, refer to the following publications, the noted sections of which are incorporated herein by reference:

1. K. Sato, et al., "High-$J_c$ Silver-Sheathed Bi-Based Superconducting Wires", *IEEE Transactions on Magnetics*, 27 (1991) 1231.

2. K. Heine, et al., "High-Field Critical Current Densities in $Bi_2Sr_2Ca_1Cu_2O_{8+x}$/Ag Wires", *Applied Physics Letters*, 55 (1989) 2441.

3. R. Flukiger, et al., "High Critical Current Densities in Bi(2223)/Ag tapes", *Superconductor Science & Technology* 5, (1992) S61.

4. D. Dimos et al., "Orientation Dependence of Grain-Boundary Critical Currents in $Y_1Ba_2Cu_3O_7$ Bicrystals", *Physical Review Letters*, 61 (1988) 219.

5. D. Dimos et al., "Superconducting Transport Properties of Grain Boundaries in $Y_1Ba_2Cu_3O_7$ Bicrystals", *Physical Review B*, 41 (1990) 4038.

6. Y. Iijima, et al., "Structural and Transport Properties of Biaxially Aligned $YBa_2Cu_3O_{7-x}$ Films on Polycrystalline Ni-Based Alloy with Ion-Beam Modified Buffer Layers", *Journal of Applied Physics*, 74 (1993) 1905.

7. R. P. Reade, et al. "Laser Deposition of biaxially textured Yttria-Stabilized Zirconia Buffer Layers on Polycrystalline Metallic Alloys for High Critical Current Y—Ba—Cu—O Thin Films", *Applied Physics Letters*, 61 (1992) 2231.

8. D. Dijkkamp et al., "Preparation of Y—Ba—Cu Oxide Superconducting Thin Films Using Pulsed Laser Evaporation from High Tc Bulk Material," *Applied Physics Letters*, 51, 619 (1987).

9. S. Mahajan et al., "Effects of Target and Template Layer on the Properties of Highly Crystalline Superconducting a-Axis Films of $YBa_2Cu_3O_{7-x}$ by DC-Sputtering," *Physica C*, 213, 445 (1993).

10. A. Inam et al., "A-axis Oriented Epitaxial $YBa_2Cu_3O_{7-x}$—$PrBa_2Cu_3O_{7-x}$ Heterostructures," *Applied Physics Letters*, 57, 2484 (1990).

11. A. Goyal et al., "High Critical Current Density Superconducting Tapes by Epitaxial Deposition of $YBa_2Cu_3O_x$ Thick Films on Biaxially Textured Metals", *Applied Physics Letters*, 69, 1795, 1996.

12. A. Goyal et al., "Conductors with Controlled Grain Boundaries: An Approach to the Next Generation, High Temperature Superconducting Wire", *Journal of Materials Research*, 12, 2924, 1997.

Hereinafter, each above listed publication is referred to by its number 1–12 enclosed in brackets.

OBJECTS OF THE INVENTION

Accordingly, it is an object of the present invention to provide new and useful biaxially textured, composite, metallic substrates and articles made therefrom.

It is another object of the present invention to provide such biaxially textured, composite, metallic substrates and articles made therefrom by plastic deformation processes including but not limited to rolling, swaging, forging, pressing, and drawing and subsequently recrystallizing high purity cubic materials to form long lengths of biaxially textured sheets, rods, wires, filaments, and other forms.

It is yet another object of the present invention to provide for the use of said biaxially textured composite forms as substrates or templates to grow epitaxial metal/alloy/ceramic layers.

Further and other objects of the present invention will become apparent from the description contained herein.

SUMMARY OF THE INVENTION

In accordance with one aspect of the present invention, the foregoing and other objects are achieved by a method of preparing a biaxially textured coated article having a cube texture which comprises the steps of: providing a metal article preform; coating at least a portion of the metal article preform with a metal coating selected from the group consisting of metals and metal alloys which produce a biaxial cube texture upon plastic deformation and subsequent recrystallization to produce a coated metal article preform; plastically deforming the coated metal article preform sufficiently that upon rapid recrystallization, a biaxial texture can be produced on the deformed surface of the metal coating; then rapidly recrystallizing at least a portion of the deformed metal coating to produce a biaxial cube texture on the recrystallized, deformed metal coating to produce a biaxially textured coated article, at least a portion of the biaxially textured coated article being characterized by non-biaxial texture.

In accordance with a second aspect of the present invention, the foregoing and other objects are achieved by a method of preparing a biaxially textured laminated article having a cube texture which comprises the steps of: providing a metal article preform; providing a metal laminate for the metal article preform comprising a metal selected from the group of consisting of metals and metal alloys which produce a biaxial cube texture upon plastic deformation and subsequent recrystallization; plastically deforming the metal laminate sufficiently that upon rapid recrystallization, a biaxial texture can be produced on the deformed surface of the metal laminate; placing the deformed metal laminate upon the metal article preform and applying conditions therebetween to bond the deformed metal laminate to the metal article preform; then rapidly recrystallizing at least a portion of the deformed metal laminate to produce a biaxial cube texture on the recrystallized, deformed metal laminate to produce a biaxially textured laminated article, at least a portion of the biaxially textured laminated article being characterized by non-biaxial texture.

In accordance with a third aspect of the present invention, the foregoing and other objects are achieved by a method of preparing a biaxially textured powder-based article having a cube texture which comprises the steps of: providing a metal tube comprising a metal selected from the group consisting of metals and metal alloys which produce a biaxial cube texture upon plastic deformation and subsequent recrystallization; filling the metal tube with metal powder to produce a powder-filled metal tube; plastically deforming the powder-filled metal tube sufficiently that upon rapid recrystallization, a biaxial texture can be produced on the deformed surface of the metal tube and sufficiently to solidify the metal powder; and rapidly recrystallizing at least a portion of the deformed metal tube to produce a biaxial cube texture on the deformed, powder-filled metal tube to produce a biaxially textured powder-based article, at least a portion of the biaxially textured powder-based article being characterized by non-biaxial texture.

In accordance with a fourth aspect of the present invention, the foregoing and other objects are achieved by a method of preparing a biaxially textured rod/plate-based article having a cube texture which comprises the steps of: providing a metal tube comprising a metal selected from the group consisting of metals and metal alloys which produce a biaxial cube texture upon plastic deformation and subsequent recrystallization; filling the metal tube with at least one of the group consisting of rods and plates to produce a rod/plate-filled metal tube; plastically deforming the rod/plate-filled metal tube sufficiently that upon rapid recrystallization, a biaxial texture can be produced on the deformed surface of the metal tube and sufficiently to solidify the at least one of the group consisting of rods and plates; and rapidly recrystallizing at least a portion of the deformed metal tube to produce a biaxial cube texture on the deformed, rod/plate-filled metal tube to produce a biaxially textured rod/plate-based article, at least a portion of the biaxially textured rod/plate-based article being characterized by non-biaxial texture.

Figure 1:
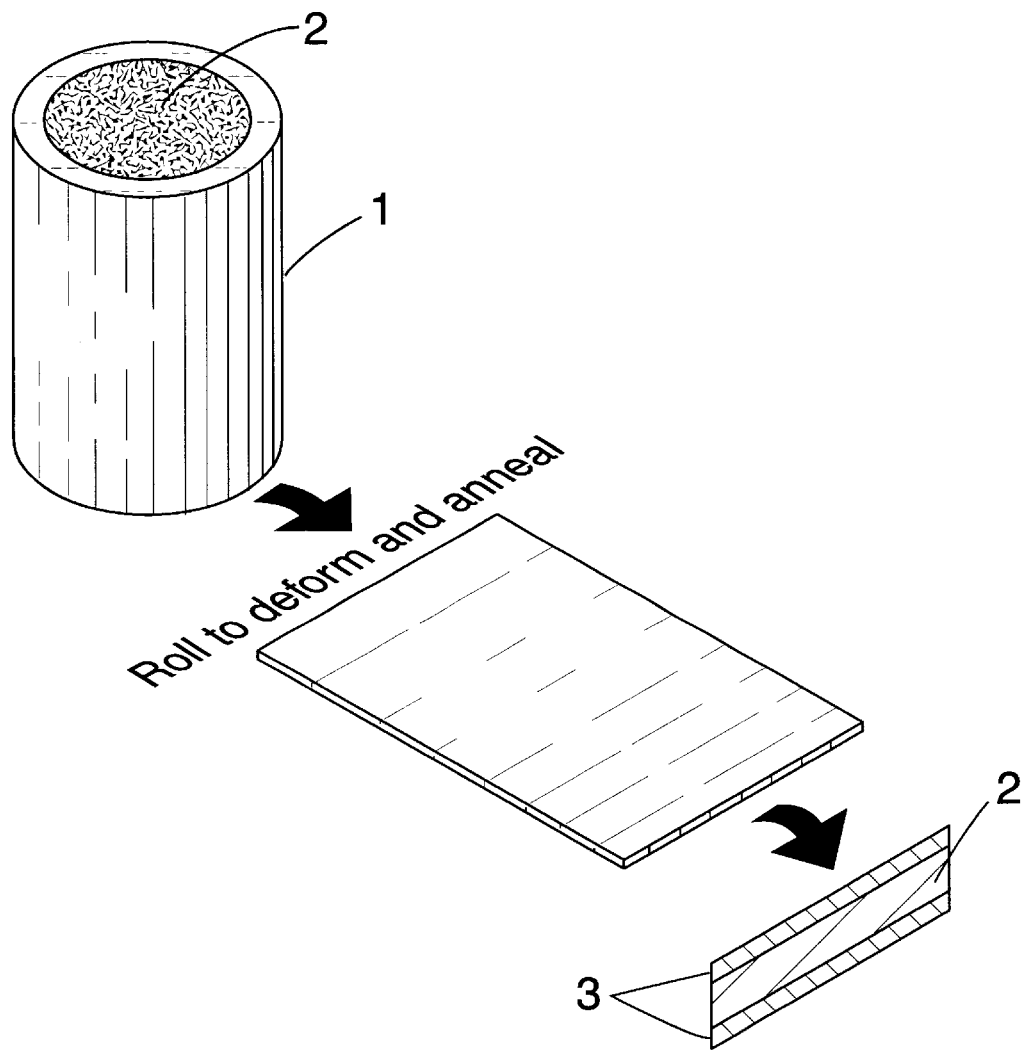
FIG. 1 is a schematic diagram showing a method for making a biaxially textured article as described in Example 1, and as claimed in claim 13.

For a better understanding of the present invention, together with other and further objects, advantages and capabilities thereof, reference is made to the following disclosure and appended claims in connection with the above-described drawings.

DETAILED DESCRIPTION OF THE INVENTION

A new method for producing biaxially textured alloys has been developed. The term biaxially textured material is used herein to define a polycrystalline material in which essentially all the grains are aligned to within 20° with respect to all three crystallographic axes. For a material that has an out-of-plane texture better than 20° FWHM as characterized by a rocking curve, biaxial texture referred to here can be characterized by an X-ray diffraction phi scan peak of no more than 200 full width half maximum (FWHM). Accordingly, the term nonbiaxially textured as used herein is defined as being characterized by an X-ray diffraction phi scan peak of more than 20° FWHM.

It is well established in the art that high purity cubic metals can be biaxially textured under certain conditions of plastic deformation and subsequent recrystallization. For example, in Cu a biaxial texture can be attained by deforming Cu by large amounts (90%) followed by recrystallization. However, this is possible only in high purity Cu. Even small lo amounts of impurity elements (i.e., 0.0025% P, 0.3% Sb, 0.18% Cd, 0.47% As, 1% Sn, 0.5% Be etc.) can completely modify the deformation behavior and hence the kind and amount of texture that develops on deformation and recrystallization. In this invention, a method is described to biaxially texture alloys of cubic materials, in particular face-centered cubic (FCC) metal based alloys. Alloys of compositions resulting in desirable physical properties can be processed according to the method of this invention to form long lengths of biaxially textured sheets, rods, strips, filaments and like articles. Such articles can then be used as templates to grow epitaxial metal/alloy/ceramic layers for a variety of applications.

Many device applications require a good control of the grain boundary character of the materials comprising the device. For example in high temperature superconductors grain boundary character is very important. The effects of grain boundary characteristics on current transmission across the boundary have been very clearly demonstrated for Y123. For clean, stochiometric boundaries, $J_c$(gb), the grain boundary critical current, appears to be determined primarily by the grain boundary misorientation. The dependence of $J_c$(gb) on misorientation angle has been determined by Dimos et al. [1] in Y123 for grain boundary types which can be formed in epitaxial films on bicrystal substrates. These include [001] tilt, [100] tilt, and [100] twist boundaries [1]. In each case high angle boundaries were found to be weak-linked. The low $J_c$ observed in randomly oriented polycrystalline Y123 can be understood on the basis that the population of low angle boundaries is small and that frequent high angle boundaries impede long-range current flow. Recently, the Dimos experiment has been extended to artificially fabricated [001] tilt bicrystals in $Tl_2Ba_2CaCu_2O_x$ [2], $Tl_2Ba_2Ca_2Cu_3O_x$ [3], $TlBa_2Ca_2Cu_2O_x$ [4], and $Nd_{1.85}Ce_{0.15}CuO_4$ [3]. In each case it was found that, as in Y123, $J_c$ depends strongly on grain boundary misalignment angle. Although no measurements have been made on Bi-2223, data on current transmission across artificially fabricated grain boundaries in Bi-2212 indicate that most large angle [001] tilt [3] and twist [5,6] boundaries are weak links, with the exception of some coincident site lattice (CSL) related boundaries [5,6]. It is likely that the variation in $J_c$ with grain boundary misorientation in Bi-2212 and Bi-2223 is similar to that observed in the well characterized cases of Y123 and Tl-based superconductors. Hence in order to fabricate high temperature superconductors with very critical current densities, it will be necessary to biaxially align all the grains. This has been shown to result in significant improvement in the superconducting properties of YBCO films [7–10].

A method for producing biaxially textured substrates was taught in a previous invention, U.S. Pat. No. 5,741,377 Structures Having Enhanced Biaxial Texture and Method of Fabricating Same, filed Apr. 4, 1995 by Goyal et al., and issued Jan. 21, 1998. That method relies on the ability to texture metals, in particular FCC metals such as copper, to produce a biaxial texture followed by epitaxial growth of additional metal/ceramic layers. Epitaxial YBCO films grown on such substrates resulted in high $J_c$. [11,12]. However, in order to realize any applications, one of the areas requiring significant improvement and modification is the nature of the substrate. First and foremost is the magnetic nature of the preferred substrate made in accordance with the invention described in U.S. Pat. No. 5,741,377. A preferred substrate is made by starting with high purity Ni, which is first thermomechanically biaxially textured, followed by epitaxial deposition of either of metal and ceramic layers. Since Ni is magnetic, the substrate as a whole is magnetic causing significant AC and DC losses in certain applications. Since Ni comprises the dominant portion of the substrate (i.e. ratio of Ni thickness to thickness of epitaxial buffer layers), most physical properties of the substrate are dominated by the properties of Ni. In particular, Pure Ni is very soft and has a low elastic modulus and yield strength. Most practical applications require significant strengthening of the substrate. Also, the thermal expansion mismatch between Ni and the superconductor or the device layer can result in cracking and may limit properties. The last shortcoming is the limitation of the lattice parameter to that of Ni alone. In case the lattice parameter can be modified to be closer to that of the ceramic layers, epitaxy would be obtained far more easily with reduced internal stresses. This again will help prevent cracking and other stress related defects and affects (e.g. delamination) in the ceramic films.

Although a method to form alloys starting from the textured Ni substrate is also suggested in U.S. Pat. No. 5,571,377, its scope is highly limited in terms of the kinds of alloys that can be fabricated. This is because only a restricted set of elements can be homogeneously diffused into the textured Ni substrate.

A method for fabricating textured alloys has been described in another previous invention, U.S. Pat. No. 5,571,377, Structures Having Enhanced Biaxial Texture and Method of Fabricating Same, filed Apr. 10, 1995 by Goyal et al., and issued Apr. 21, 1998. The invention involved the use of alloys of cubic metals such as Cu, Ni, Fe, Al and Ag for making biaxially textured sheets such that the stacking fault frequency of the alloy with all the alloying additions is less than 0.009. In case it is not possible to make an alloy with desired properties to have the stacking fault frequency less than 0.009 at room temperature, then deformation can be carried at higher temperatures where the stacking fault frequency is less than 0.009.

Here, a new method is described for fabricating strongly biaxially textured surfaces of composites which have bulk properties (i.e. thermal expansion, mechanical properties, nonmagnetic nature, etc.) more nearly ideal for the application of superconducting layers, the biaxially textured surfaces also being more nearly ideal in terms of lattice parameter and chemical reactivity.

FIG. 1 shows schematically a powder-in-tube configuration wherein a tube 1 of the desired coating material, for example Pd or Ni, is filled with alloy powder 2 of a desired composition and having the desired physical properties for the electronic device or conducting article in question. Physical properties may be for example particular values of mechanical strength, yield strength, fracture strength, thermal expansion, magnetism, and the like, for example, as a function of temperature.

The powder or filler material can be a mixture of metals, alloys or metals and ceramic particles. In one embodiment the powder or filler material comprises particles which may be of various specific shapes such as rods or plates or other shapes which can contribute to desirable mechanical or physical properties. The rods, plates, and other shapes may comprise metals, metal alloys, ceramic compositions, and other compositions known to the skilled artisan, and combinations thereof. As used herein, a rod/plate filled metal tube refers to a metal tube filled with powder which comprises such rods, plates, other shapes, and combinations thereof.

Once filled, the tube is closed, for example by inserting a plug made of the same material as the tube. The plug can then be sealed by various methods, for example electron beam welding or mechanical swaging. The tube is then plastically deformed by a standard deformation technique such as rolling so that the tube material undergoes a high deformation. The powder or filler material inside the tube is sintered, bonded, fused, or otherwise made into a solid of desirable properties by means well known to the skilled artisan. Typically the required deformation of the tube is greater than 90%. Typical rolling schedules are with reversing the rolling direction after each pass. After rolling a well-developed copper-type rolling texture 3 as referred to in [17] is formed. This is followed by rapid recrystallization of the composite material to recrystallize the tube material without any significant diffusion of elements from the interior.

EXAMPLE I

In one comparison, Ni tubes with an outside diameter of one inch and a wall thickness of 5 mm were filled with two kinds of powders. In the first case, pure Cu powder was used and in the second case a powder of a Ni-superalloy composition was used. Once the tubes were filled with the powders in a glove box, they were closed with a plug and then sealed by mechanical swaging. The tubes were then mechanically rolled according to the following schedule:

10% reduction per pass reverse rolling at each pass total reduction greater than 90% light mineral oil as a lubricant.

Figure 2:
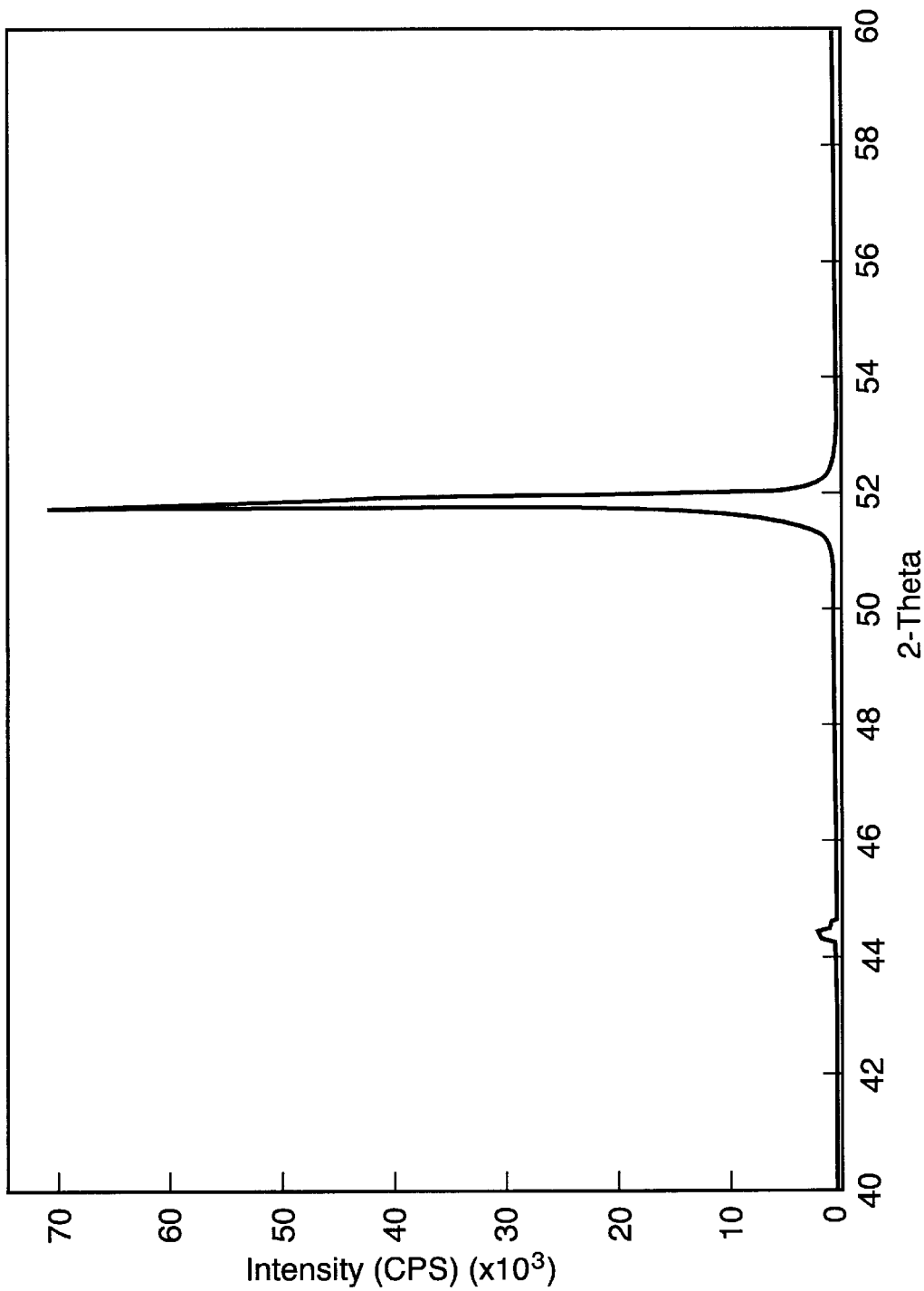
FIG. 2 is an X-ray diffraction θ–2θ scan for a Ni-tube filled with Cu powder, rolled by deformations greater than 90% and annealed at 600° C.
Figure 3:
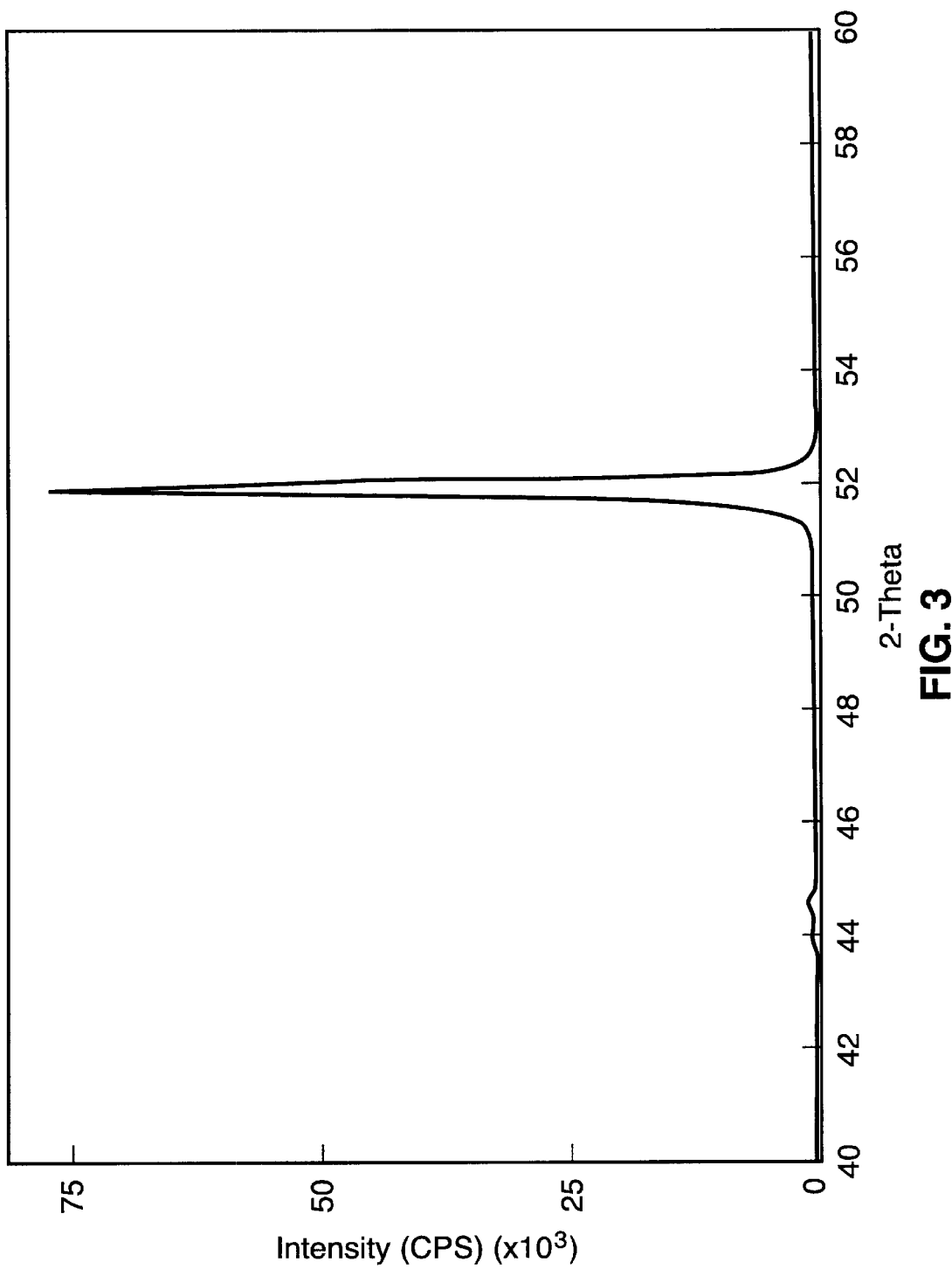
FIG. 3 is an X-ray diffraction θ–2θ scan for a Ni-tube filled with Ni-based superalloy powder of composition Ni-73%, Al-16%, Cr-6%, Mo-3%, Fe-1.2% and $Y_2O_3$-0.8%, and rolled by deformations greater than 90% and annealed at 600° C.
Figure 4:
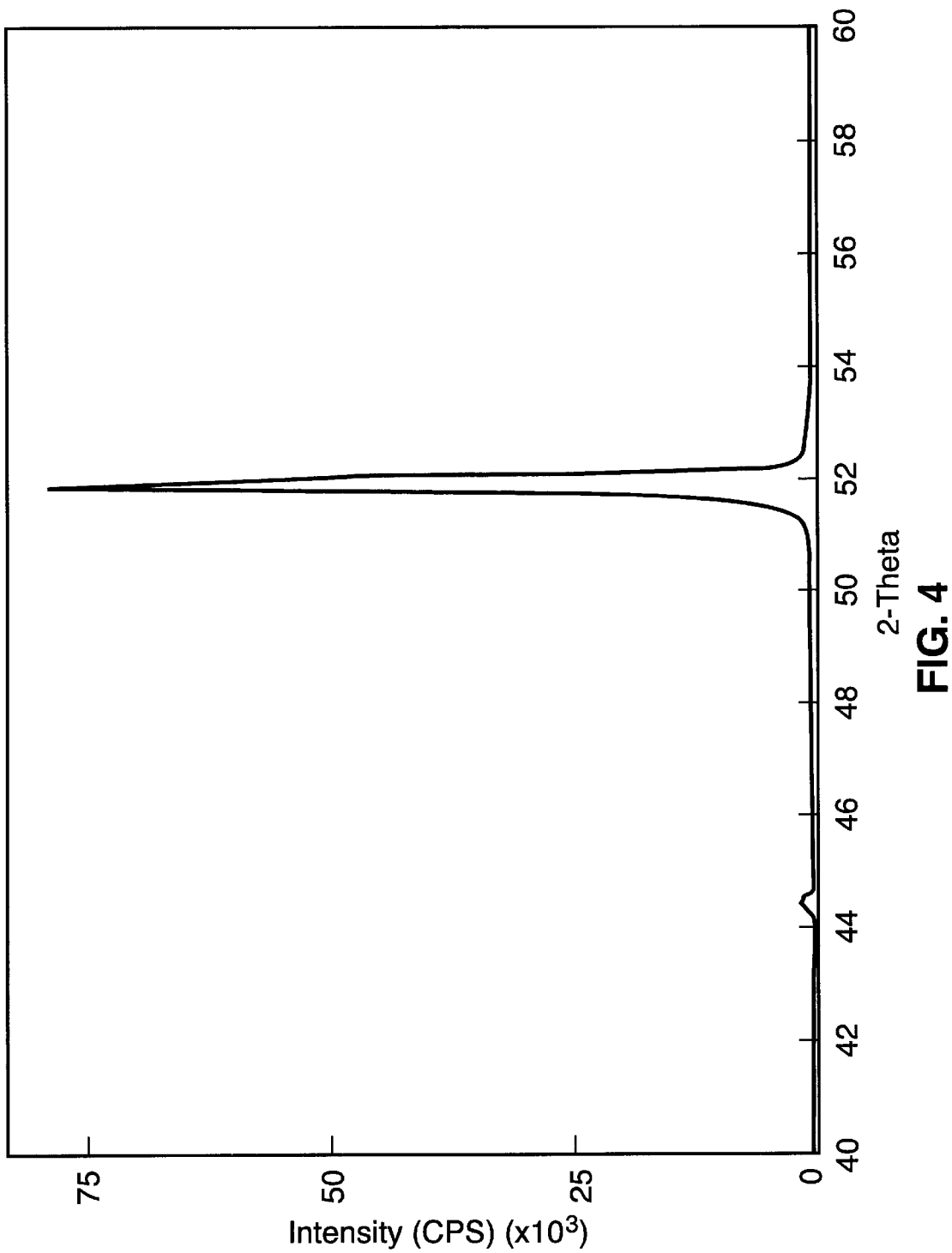
FIG. 4 is an X-ray diffraction θ–2θ scan for a Ni-tube filled with Cu powder, rolled by deformations greater than 90% and annealed at 800° C.
Figure 5:
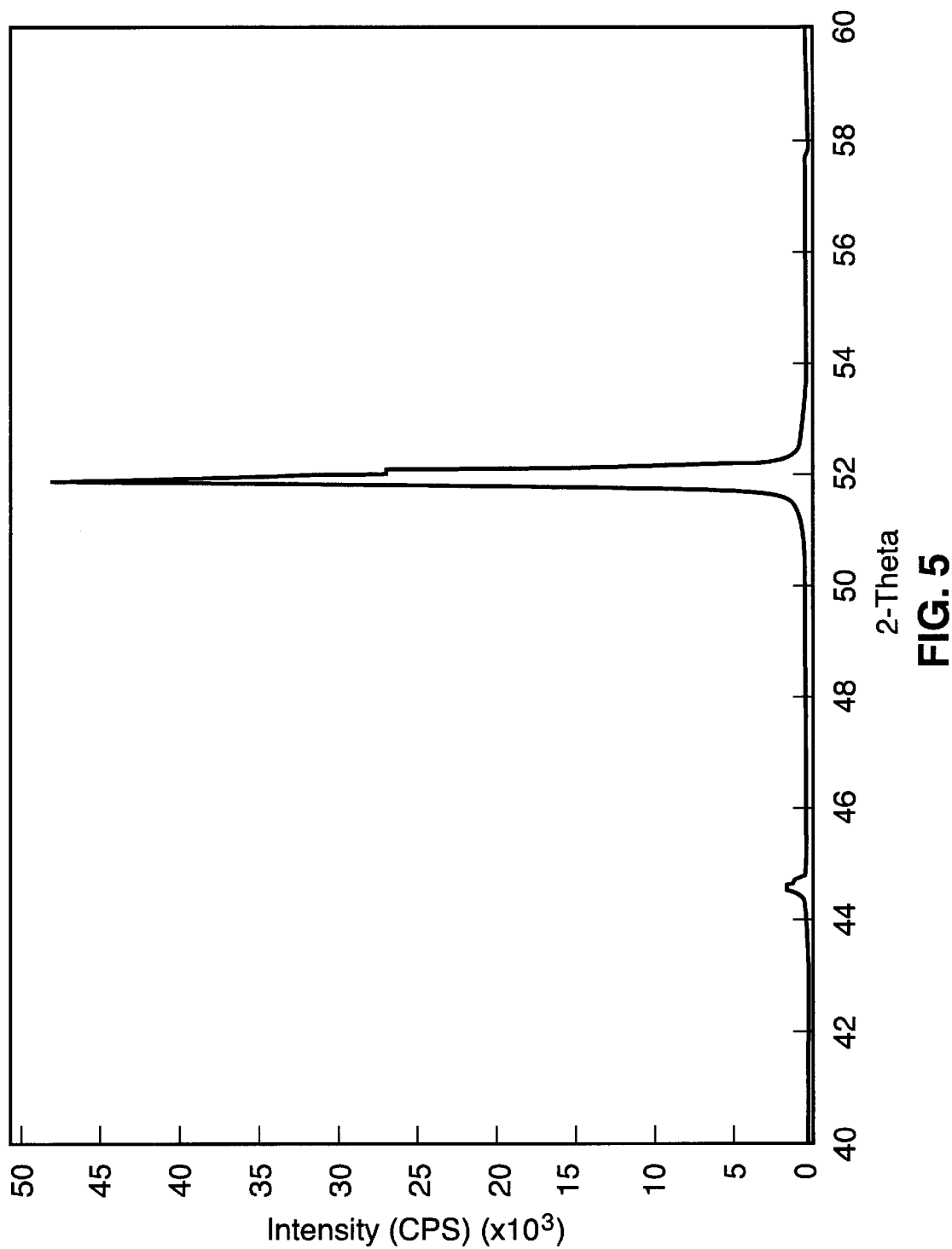
FIG. 5 is an X-ray diffraction θ–2θ scan for a Ni-tube filled with Ni-based superalloy powder of composition Ni-73%, Al-16%, Cr-6%, Mo-3%, Fe-1.2% and $Y_2O_3$-0.8%, and rolled by deformations greater than 90% and annealed at 800° C.
Figure 6:
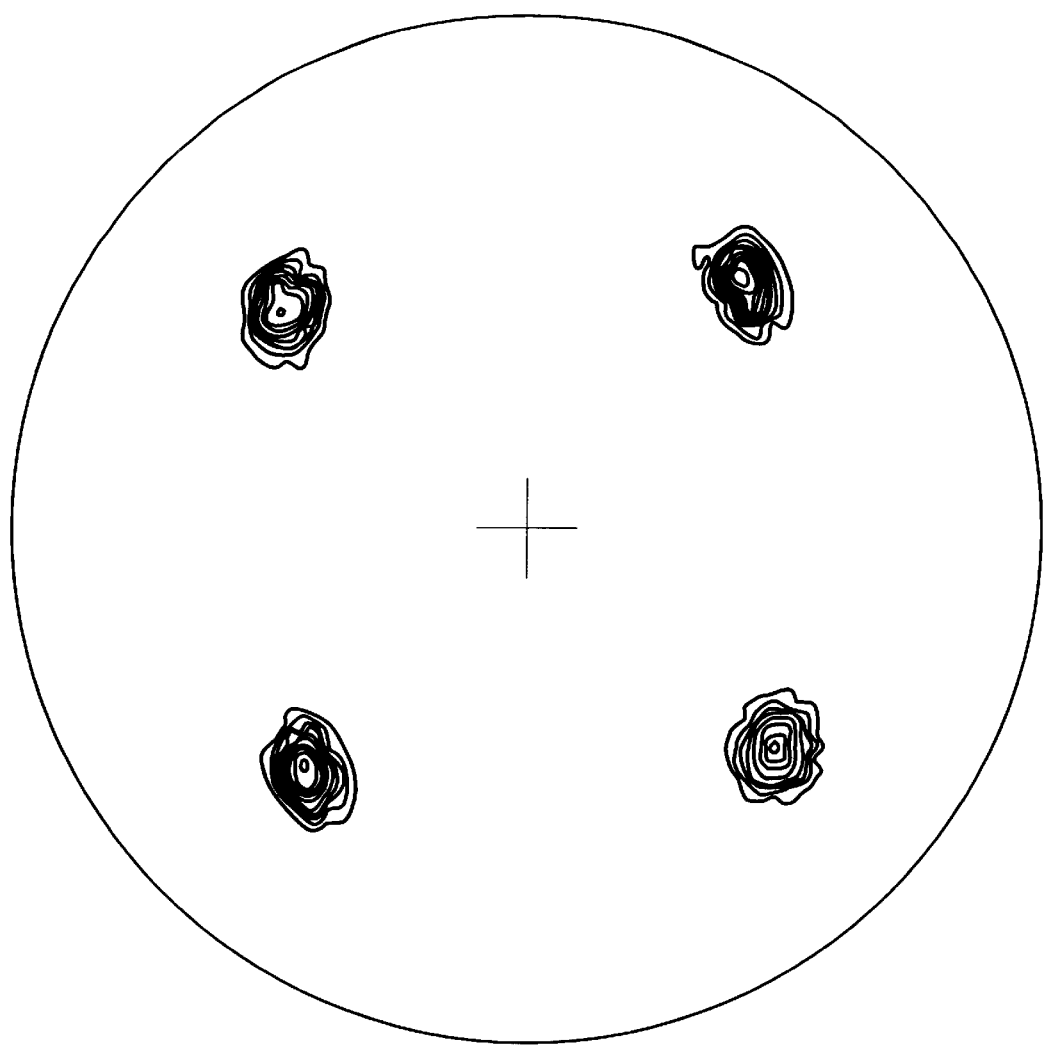
FIG. 6 is an X-ray diffraction (111) pole figure for a sample made by deforming a Ni-tube filled with Ni-based superalloy powder of composition Ni-73%, Al-16%, Cr-6%, Mo-3%, Fe-1.2% and $Y_2O_3$-0.8%, and rolled by deformations greater than 90% and annealed at 800° C.
Figure 7:
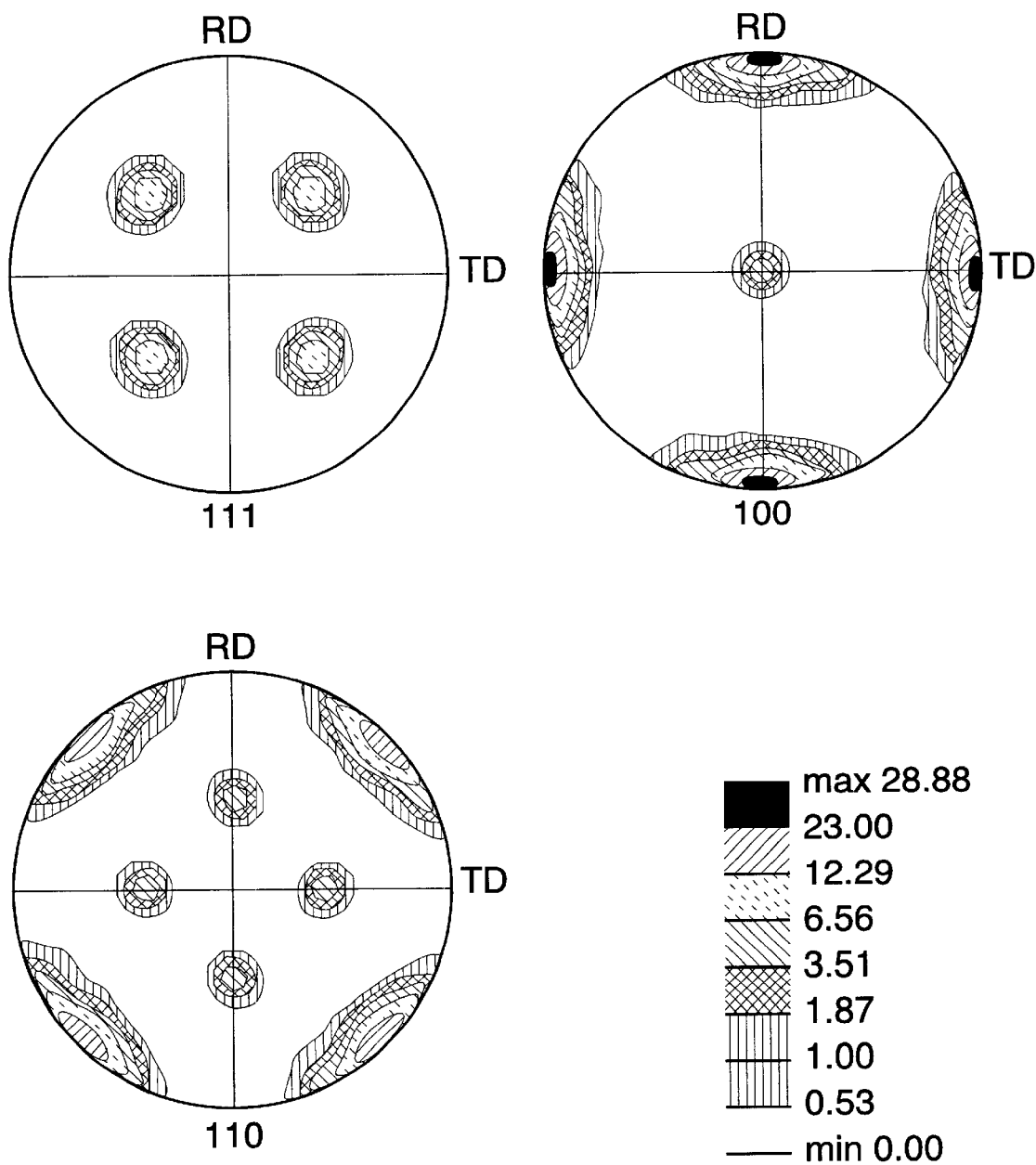
FIG. 7 is electron backscatter Kikuchi diffraction data from the Ni surface of a sample made by deforming a Ni-tube filled with a Ni-based superalloy powder of composition Ni-73%, Al-16%, Cr-6%, Mo-3%, Fe-1.2% and $Y_2O_3$-0.8%, and then rolled by deformations greater than 90% and annealed at 800° C. (111), (100), and (110) pole figures show the presence of only the {100}<100> cube texture.
Figure 8:
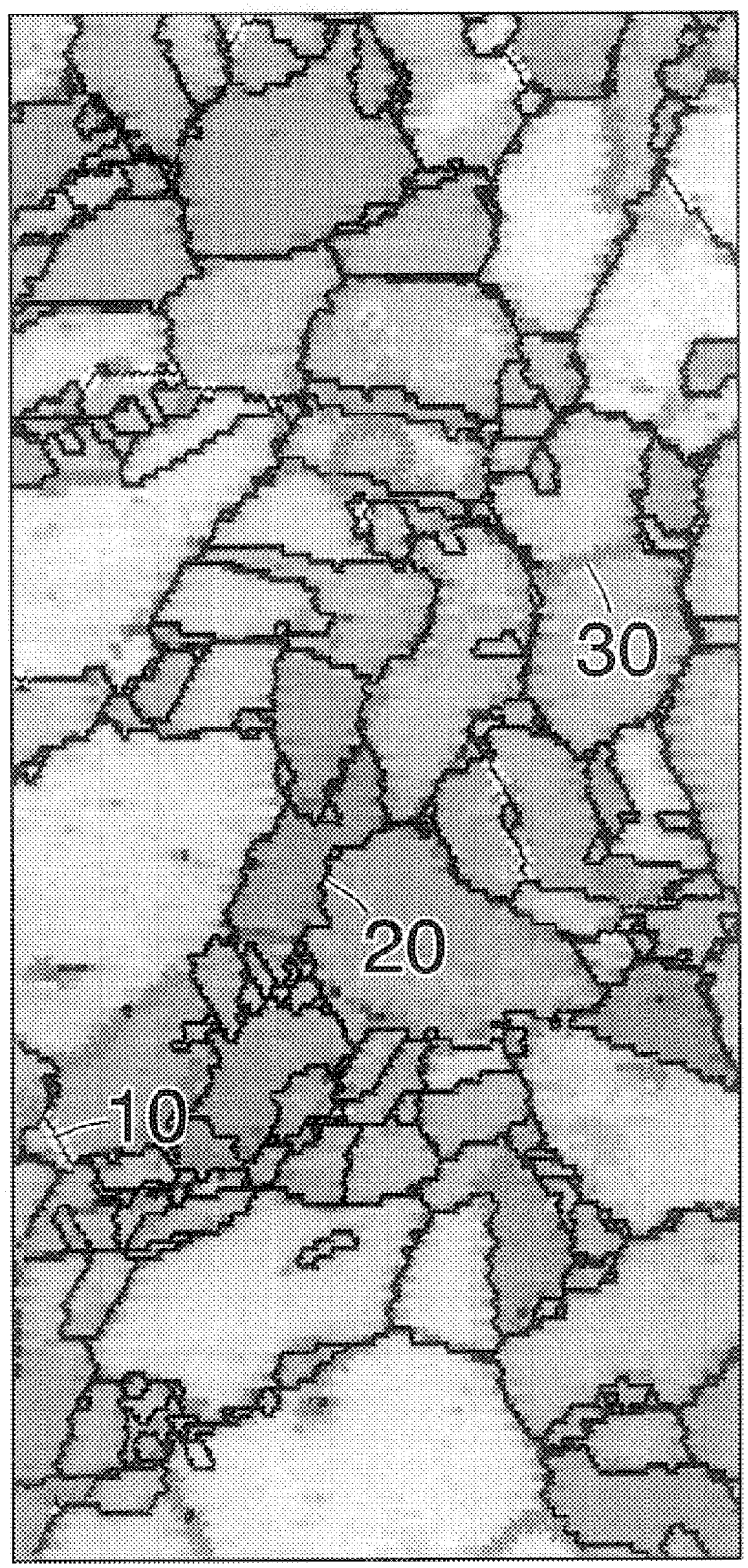
FIG. 8 is a grain orientation image created using electron backscatter Kikuchi diffraction from a sample made by deforming Ni tube filled with a Ni-based superalloy powder of composition Ni-73%, Al-16%, Cr-6%, Mo-3%, Fe-1.2% and $Y_2O_3$-0.8%, and rolled by deformations greater than 90% and annealed at 800° C.

After rolling was complete, the materials were annealed at various temperatures. FIGS. 2 and 3 show. X-ray diffraction θ–2θ scans for samples annealed at 600° C. and from the tube filled with Cu powder and the superalloy powder (of composition Ni-73%, Al-16%, Cr6%, Mo-3%, Fe-1.2% and $Y_2O_3$-08%) respectively. Only the (200) peak from the Ni is seen, showing the cube texture in the material. FIGS. 4 and 5 show the X-ray diffraction θ–2θ scans from samples annealed at 800° C. and from the tube filled with Cu powder and the superalloy powder respectively. Since 800° C. is the highest temperature required for forming the superconductor phase in most film deposition techniques, such substrates are adequate in that they retain their texture at high temperatures. FIG. 6 is an X-ray diffraction (111) pole figure of the exterior Ni coating. Only four peaks corresponding to the exact locations of the cube texture, i.e. {100}<100> are seen. FIG. 7 shows (111), (100), and (101) pole figures from the data taken from, such a scan. Each pole figure shows that only a single orientation, namely, the cube orientation, corresponding to {100}<100> is present. Once the data was gathered, a grain orientation image was developed. Hypothetical hexagonal grid was superimposed at each point from where a diffraction pattern was recorded. Grain boundary misorientations were then calculated from all resulting grain boundaries. The micrograph was then reconstructed and is shown in FIG. 8. Superimposed on the micrograph are three types of grain boundaries. The thinnest boundaries 10 are boundaries with grain boundary misorientations between 1° and 5°, thicker boundaries 20 are boundaries with misorientations between 5° and 10°, and thicker lighter boundaries 30 are boundaries with misorientations greater than 10°. Clearly, the material comprises primarily small angle boundaries which are highly desirable in the substrate.

EXAMPLE II

Figure 9:
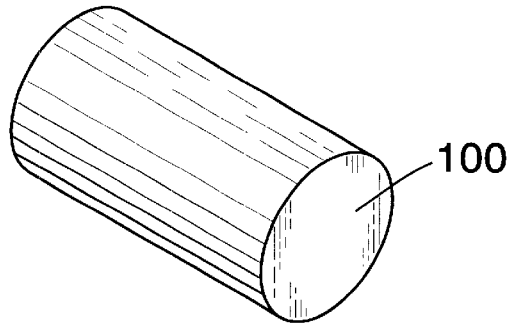
FIG. 9 is a schematic diagram showing a method for making a biaxially textured composite article as described in Example II, and as claimed in claim 1.
Figure 9:
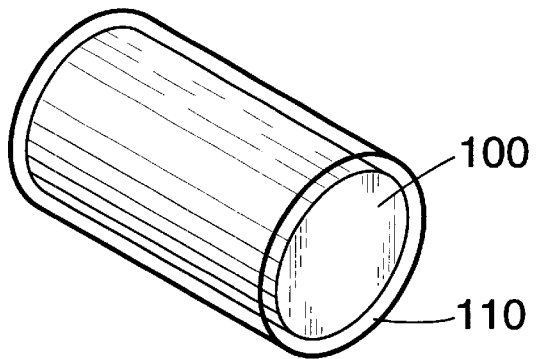
Figure 9:
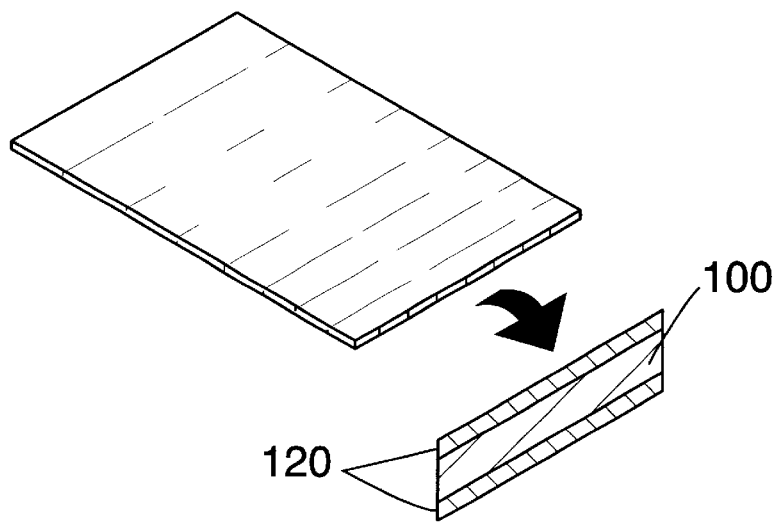

Begin with a preform such as a rod or billet 100 of an alloy which does not texture, but has the ideal physical properties desired, as shown in FIG. 9. Physical properties could be particular values of mechanical strength, yield strength, fracture strength, thermal expansion, magnetism, and the like, for example, as a function of temperature. Laminate or coat the rod or billet 100 with a metal or alloy 110 which is known to produce a biaxial texture 120 upon plastic deformation and recrystallization, such as Ni. Plastically deform, for example by rolling, the composite structure such that the coating is deformed for example greater than 90% for Ni. This is followed by rapid recrystallization of the laminate or coating to produce a biaxial texture 120. Since the texture is already produced in the laminate or coating prior to any interdiffusion of elements from the inside, texture of the laminate or coating is not significantly affected. Epitaxial multilayers (metal/oxide) may now be deposited on the biaxial texture.

Figure 10:
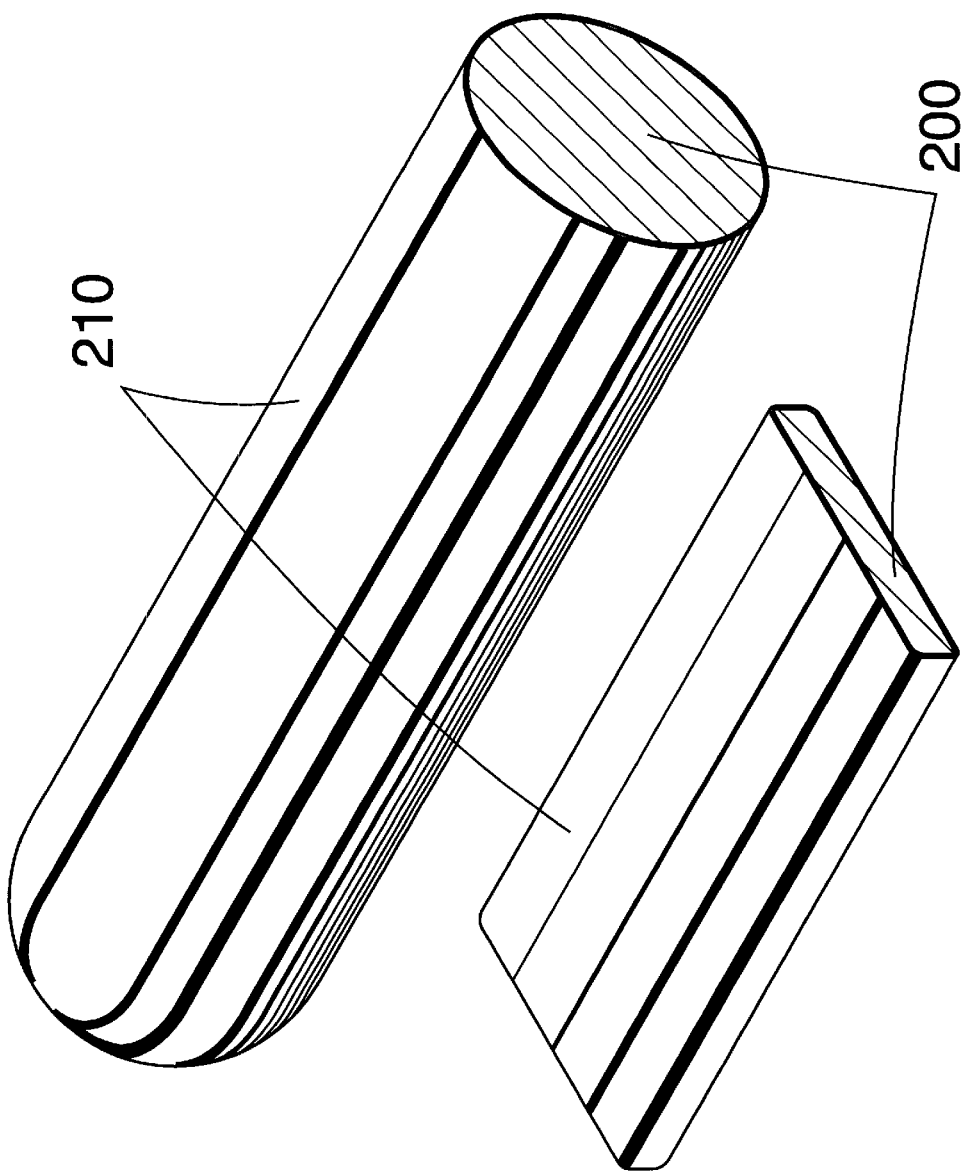
FIG. 10 is a photograph of a Cu rod and plate coated with Ni using standard electroplating techniques.

FIG. 10 shows the method using the standard technique of electroplating to provide the laminate or coating 210 on a copper rod 200.

EXAMPLE III

Figure 11A:
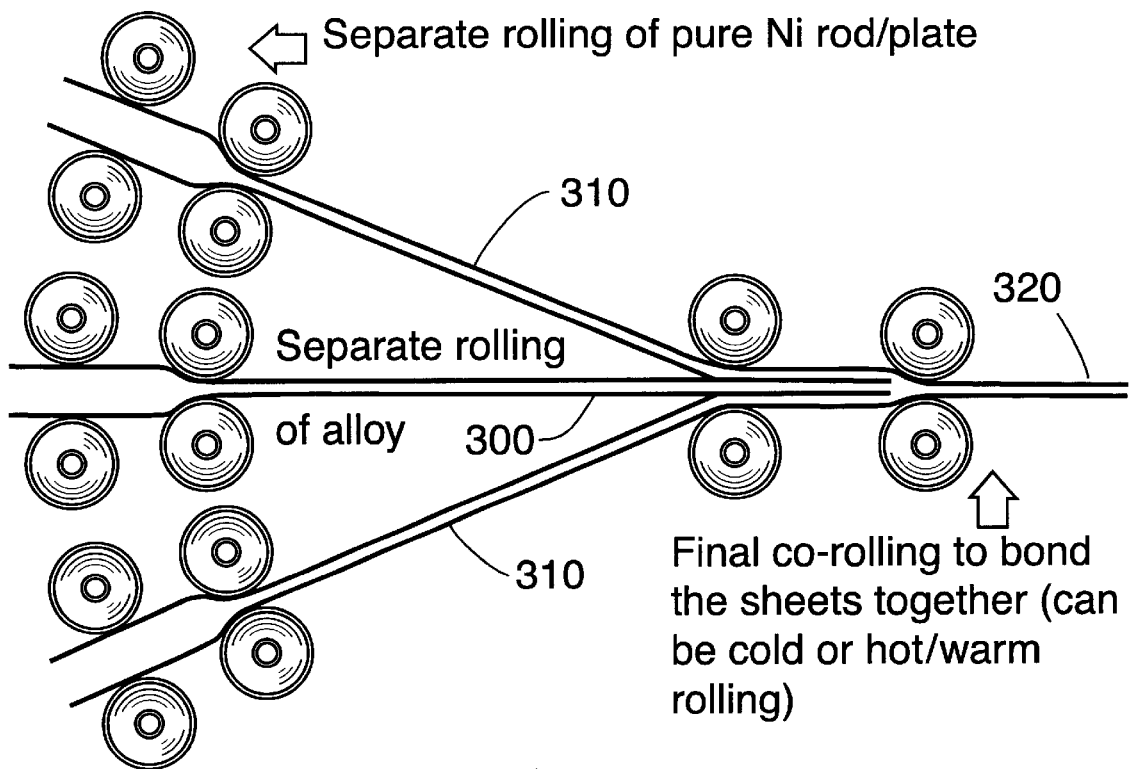
FIG. 11a & 11b are schematic diagrams showing a method for making a biaxially textured composite article as described in Example III, and as claimed in claim 7.

If the deformation behavior of the preform and the laminate or coating are very different, as shown in FIG. 11a, the two may be plastically deformed under different conditions, followed by final steps where further bonding methods such as co-rolling are employed to bond the biaxially textured laminate or coating 310 with the preform 300. Of course, in the laminate, the plastic deformation is performed to obtain a well developed copper-type texture prior to bonding. Bonding to produce a bonded structure 320 is affected usually by a combination of mechanical pressure and temperature. This is followed by annealing to produce the biaxial texture in the laminate or coating. This method and structure is illustrated in FIGS. 11a.

Figure 11B:
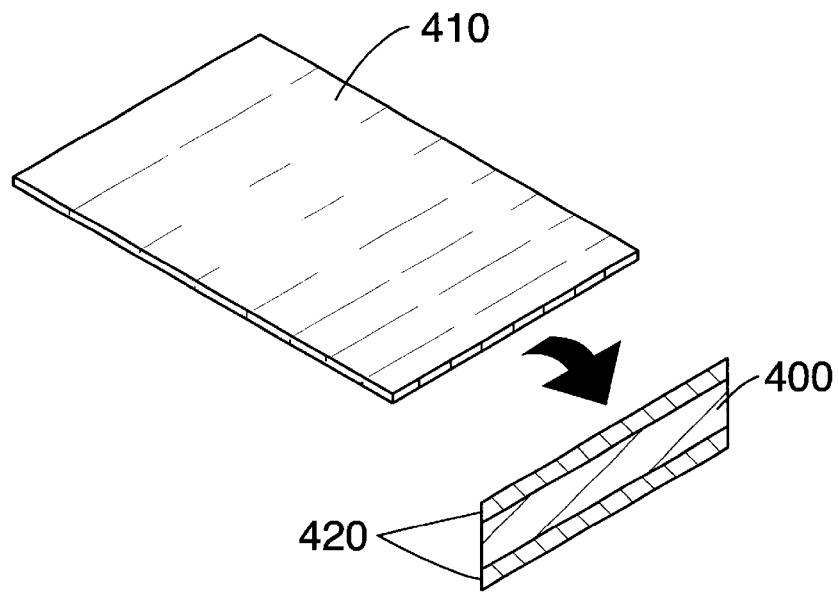

Similarly, FIG. 11b shows a substrate 400 having an annealed Ni tape 410 bonded thereupon by rolling, and a cube texture 420 produced on the Ni tape.

While there has been shown and described what are at present considered the preferred embodiments of the invention, it will be obvious to those skilled in the art that various changes and modifications can be made therein without departing from the scope of the invention defined by the appended claims.

What is claimed is:

1. A method of preparing a biaxially textured coated article having a cube texture comprising the steps of:
    a. providing a metal article preform;
    b. coating at least a portion of the metal article preform with a metal coating selected from the group consisting of metals and metal alloys which produce a biaxial cube texture upon plastic deformation and subsequent recrystallization to produce a coated metal article preform;
    c. plastically deforming the coated metal article preform sufficiently that upon rapid recrystallization, a biaxial texture will be produced on at least a portion of the deformed surface of the metal coating; and
    d. rapidly recrystallizing at least a portion of the deformed metal coating to produce a biaxial cube texture characterized by an x-ray diffraction phi scan peak of no more than 20° FWHM in the recrystallized, deformed metal coating to produce a biaxially textured coated article, at least a portion of the biaxiallytextured coated article being characterized by non-biaxial texture.

2. The method of preparing a biaxially textured coated article as described in claim 1 wherein the step of providing the metal article preform is accomplished by providing a metal article preform comprising at least one of the group consisting of Ni, Cu, Al, Ag and Fe and alloys of any of the foregoing.

3. The method of preparing, a biaxially textured coated article as described in claim 1 wherein the step of coating the metal article preform is accomplished by applying a metal coating comprising at least one of the group consisting of Ni, Cu, Pd, Pt, and Ag and alloys of any of the foregoing.

4. The method of preparing a biaxially textured coated article as described in claim 1 further comprising the additional step of:
    e. depositing onto at least a portion of the biaxial texture at least one epitaxial layer comprising at least one oxide selected from the group consisting of Y, Ce, La, Zr, Sr, and Ti oxides and Y, Ce, La, Zr, Sr, and Ti nitrides.

5. The method of preparing a biaxially textured coated article as described in claim 4 further comprising the step of:
    f. applying by a method selected from the group consisting of bonding and epitaxially depositing upon at least a portion of the epitaxial layer at least one of the group consisting of buffer layers, electromagnetic devices, and electro-optical devices.

6. The method of preparing a biaxially textured coated article as described in claim 5 wherein the at least one epitaxial layer is characterized by the property of superconductivity.

7. A method of preparing a biaxially textured laminated article having a cube texture comprising the steps of:
    a. providing a metal article preform;
    b. providing a metal laminate for the metal article preform comprising a metal selected from the group of consisting of metals and metal alloys which produce a biaxial cube texture upon plastic deformation and subsequent recrystallization;
    c. plastically deforming the metal laminate sufficiently that upon rapid recrystallization, a biaxial texture will be produced on at least a portion of the deformed surface of the metal laminate;
    d. placing the deformed metal laminate upon the metal article preform and applying conditions therebetween to bond the deformed metal laminate to the metal article preform; then
    e. rapidly recrystallizing at least a portion of the deformed metal laminate to produce a biaxial cube texture characterized by an x-ray diffraction phi scan peak of no more than 20° FWHM in the recrystallized, deformed metal laminate to produce a biaxially textured laminated article, at least a portion of the biaxially textured laminated article being characterized by non-biaxial texture.

8. The method of preparing a biaxially textured laminated article as described in claim 7 wherein the step of providing a metal article preform is accomplished by providing a metal article preform comprising at least one of the group consisting of Ni, Cu, Al, Ag and Fe and alloys of any of the foregoing.

9. The method of preparing a biaxially textured laminated article as described in claim 7 wherein the step of providing the metal laminate is accomplished by providing a metal laminate comprising at least one of the group consisting of Ni, Cu, Pd, Pt, and Ag and alloys of any of the foregoing.

10. The method of preparing a biaxially textured laminated article as described in claim 7 further comprising the additional step of:

f. depositing onto at least a portion of the biaxial texture at least one epitaxial layer comprising at least one oxide selected from the group consisting of Y, Ce, La , Zr, Sr, and Ti oxides and Y, Ce, La, Zr, Sr, and Ti nitrides.

11. The method of preparing a biaxially textured laminated article as described in claim 10 further comprising the step of:

g. applying by a method selected from the group consisting of bonding and epitaxially depositing upon at least a portion of the epitaxial layer at least one of the group consisting of buffer layers, electromagnetic devices and electro-optical devices.

12. The method of preparing a biaxially textured laminated article as described in claim 11 wherein the at least one epitaxial layer is characterized by the property of superconductivity.

13. A method of preparing a biaxially textured powder-based article having a cube texture comprising the steps of:

a. providing a metal tube comprising a metal selected from the group consisting of metals and metal alloys which produce a biaxial cube texture upon plastic deformation and subsequent recrystallization;

b. filling the metal tube with metal powder to produce a powder-filled metal tube;

c. plastically deforming the powder-filled metal tube sufficiently that upon rapid recrystallization, a biaxial texture will be produced on at least a portion of the deformed surface of the metal tube and sufficiently to solidify the metal powder; and d. rapidly recrystallizing at least a portion of the deformed metal tube to produce a biaxial cube texture characterized by an x-ray diffraction phi scan peak of no more than 20° FWHM in the deformed, powder-filled metal tube to produce a biaxially textured powder-based article, at least a portion of the biaxially textured powder-based article being characterized by non-biaxial texture.

14. The method of preparing a biaxially textured powder-based article as described in claim 13 wherein the step of providing the metal tube is accomplished by providing a metal tube comprising at least one of the group consisting of Ni, Cu, Pd, Pt, and Ag and alloys of any of the foregoing.

15. The method of preparing a biaxially textured powder-based article as described in claim 13 wherein the step of filling the metal tube with metal powder is accomplished by filling the metal tube with metal powder comprising at least one of the group consisting of Ni, Cu, Al, Ag, and Fe and alloys of any of any of the foregoing.

16. The method of preparing a biaxially textured powder-based article as described in claim 13 further comprising the additional step of:

e. depositing onto at least a portion of the biaxal texture at least one epitaxial layer comprising at least one of oxide selected from the group consisting of Y, Ce, La, Zr, Sr, and Ti oxides and Y, Ce, La Zr, Sr, and Ti nitrides.

17. The method of preparing a biaxially textured powder-based article as described in claim 16 further comprising the additional step of:

f. applying by a method selected from the group consisting of bonding and epitaxially depositing onto at least a portion of the epitaxial layer at least one of the group consisting of buffer layers, electromagnetic devices and electro-optical devices.

18. The method of preparing a biaxially textured powder-based article as described in claim 17 wherein the at least one epitaxial layer is characterized by the property of superconductivity.

19. A method of preparing a biaxially textured rod/plate-based article having a cube texture comprising the steps of:

a. providing a metal tube comprising a metal selected from the group consisting of metals and metal alloys which produce a biaxial cube texture upon plastic deformation and subsequent recrystallization;

b. filling the metal tube with at least one of the group consisting of rods and plates to produce a rod/plate-filled metal tube;

c. plastically deforming the rod/plate-filled metal tube sufficiently that upon rapid recrystallization, a biaxial texture will be produced on at least a portion of the deformed surface of the metal tube and sufficiently to solidify the at least one of the group consisting of rods and plates; and d. rapidly recrystallizing at least a portion of the deformed metal tube to produce a biaxial cube texture characterized by an x-ray diffraction phi scan peak of no more than 20° FWHM in the deformed, rod/plate-filled metal tube to produce a biaxially textured rod/plate-based article, at least a portion of the biaxially textured rod/plate-based article being characterized by non-biaxial texture.

20. The method of preparing a biaxially textured rod/plate-based article as described in claim 19 wherein the step of providing the metal tube is accomplished by providing a metal tube comprising at least one of the group consisting of Ni, Cu, Pd, Pt, and Ag and alloys of any of the foregoing.

21. The method of preparing a biaxially textured rod/plate-based article as described in claim 19 wherein the step of filling the metal tube is accomplished by filling the metal tube with at least one of the group consisting of rods and plates, the rods and plates further comprising metals, metal alloys, ceramic compositions and combinations thereof, the metal therein comprising at least one of the group consisting of Ni, Cu, Al, Ag, and Fe and alloys of any of any of the foregoing.

22. The method of preparing a biaxially textured rod/plate-based article as described in claim 19 further comprising the additional step of:

e. depositing onto at least a portion of the biaxial texture at least one epitaxial layer comprising at least one oxide selected from the group consisting of Y, Ce, La and Zr oxides.

23. The method of preparing a biaxially textured rod/plate-based article as described in claim 22 further comprising the additional step of:

f. applying by a method selected from the group consisting of bonding and epitaxially depositing upon at least a portion of the epitaxial layer at least one of the group consisting of buffer layers, electromagnetic devices and electro-optical devices.

24. The method of preparing a biaxially textured rod/plate-based article as described in claim 23 wherein the at least one epitaxial layer is characterized by the property of superconductivity.

* * * * *